(12) United States Patent
Denier

(10) Patent No.: US 8,242,852 B2
(45) Date of Patent: Aug. 14, 2012

(54) OSCILLATOR ARRANGEMENT AND METHOD FOR GENERATING A PERIODIC SIGNAL

(75) Inventor: Urs Denier, Rapperswil (CH)

(73) Assignee: Austriamicrosystems AG, Unterpremstatten (AT)

( * ) Notice: Subject to any disclaimer, the term of this patent is extended or adjusted under 35 U.S.C. 154(b) by 493 days.

(21) Appl. No.: 11/991,990

(22) PCT Filed: Aug. 31, 2006

(86) PCT No.: PCT/EP2006/008541
§ 371 (c)(1),
(2), (4) Date: May 3, 2010

(87) PCT Pub. No.: WO2007/031200
PCT Pub. Date: Mar. 22, 2007

(65) Prior Publication Data
US 2010/0231312 A1    Sep. 16, 2010

(30) Foreign Application Priority Data

Sep. 12, 2005 (DE) .................. 10 2005 043 376

(51) Int. Cl.
*H03K 3/26* (2006.01)
(52) U.S. Cl. .................. 331/111; 331/143; 331/176
(58) Field of Classification Search .............. 331/111, 331/143, 176
See application file for complete search history.

(56) References Cited

U.S. PATENT DOCUMENTS

| 4,205,279 | A | | 5/1980 | Beutler |
| 4,714,901 | A | | 12/1987 | Jain et al. |
| 4,734,656 | A | | 3/1988 | Miller |
| 4,868,525 | A | | 9/1989 | Dias |
| 4,963,840 | A | | 10/1990 | Thommen |
| 5,315,230 | A | | 5/1994 | Cordoba et al. |
| 5,461,590 | A | | 10/1995 | Cordoba et al. |
| 5,604,467 | A | | 2/1997 | Matthews |
| 5,668,508 | A | * | 9/1997 | Pulvirenti et al. ............. 331/111 |
| 6,020,792 | A | | 2/2000 | Nolan et al. |
| 7,598,822 | B2 | * | 10/2009 | Rajagopal et al. ............. 331/176 |

(Continued)

FOREIGN PATENT DOCUMENTS
DE    10157292 A1    6/2003

(Continued)

OTHER PUBLICATIONS

I.M. Filanovsky et al., "A CMOS Current-Controlled Multivibrator", Int'l. Journal of Electronics, Taylor and Francis, Ltd., London, GB, vol. 73, No. 2, Aug. 1, 1992, pp. 333-344.

(Continued)

*Primary Examiner* — Arnold Kinkead
(74) *Attorney, Agent, or Firm* — Cozen O'Connor

(57) ABSTRACT

An oscillator arrangement is specified, in which a relaxation oscillator is refined to the extent that the comparator (2) to be used for comparing the voltage across a charge storage device (1) with a switching threshold ($V_{TH}$) is a current comparator with two current branches (5, 6). One of these two current branches is used in the present case for guiding a charging or discharging current of the charge storage device (1). In this way, a current branch is eliminated, so that the proposed principle is preferably suitable for so-called ultra low power applications.

18 Claims, 4 Drawing Sheets

U.S. PATENT DOCUMENTS

2002/0121940 A1 9/2002 Chrissostomidis et al.
2004/0000941 A1 1/2004 Kuo et al.

FOREIGN PATENT DOCUMENTS

DE 69819533 T2 9/2004
EP 1653617 A1 5/2006

OTHER PUBLICATIONS

Cernea, R.-A., et al., "Nonvolatile Memories: A 1Mb Flash EPROM", IEEE Int'l. Solid-State Circuits Conference, New York, U.S., vol. 32, Feb. 1989, pp. 138-139, 316.
Annema, Anne-Johan, "Low-Power Bandgap References Featuring DTMOST's", IEEE Journal of Solid-State Circuits, vol. 34, No. 7, Jul. 1999, pp. 949-955.
Camacho-Galeano, E.M., et al., "A 2-nW 1.1-V Self-Biased Current Reference in CMOS Technology", IEEE Transactions on Circuits and Systems, II:Express Briefs, vol. 52, No. 2, Feb. 2005, pp. 61-65.
Flynn, M.P., et al., "A 1.2 µm CMOS Current-Controlled Oscillator", IEEE Journal of Solid-State Circuits, vol. 27, No. 7, Jul. 1992, pp. 982-987.
Gierkink, S.L.J., et al., "A Coupled Sawtooth Oscillator Combining Low Jitter with High Control Linearity", IEEE Journal of Solid-State Circuits, vol. 37, No. 6, Jun. 2002, pp. 702-710.
Oguey, H.J., et al., "CMOS Current Reference without Resistance", IEEE Journal of Solid-State Circuits, vol. 32, No. 7, Jul. 1997, pp. 1132-1135.
Vittoz, E.A., et al., "High-Performance Crystal Oscillator Circuits: Theory and Application", IEEE Journal of Solid-State Circuits, vol. 23, No. 3, Jun. 1988, pp. 774-783.
Vittoz, E.A., et al., "CMOS Analog Integrated Circuits Based on Weak Inversion Operation", IEEE Journal of Solid-State Circuits, vol. SC-12, No. 3, Jun. 1977, pp. 224-231.

* cited by examiner

OSCILLATOR ARRANGEMENT AND METHOD FOR GENERATING A PERIODIC SIGNAL

This is a U.S. national stage of application No. PCT/EP2006/008541, filed on 31 Aug. 2006.

This patent application claims the priority of German patent application no. 10 2005 043 376.6 filed Sep. 12, 2005 the disclosure content of which is hereby incorporated by reference.

FIELD OF THE INVENTION

The present invention relates to an oscillator arrangement comprising a charge storage device and a comparator with a first input, which is connected to the charge storage device for feeding a signal dependent on its charge state, with a second input for feeding a switching threshold, and with an output, which is connected to the charge storage device. With respect to the method, the invention relates to a method for generating a periodic signal with the steps: charging a charge storage device with a charging current, comparing a signal dependent on the charge state of the charge storage device with a switching threshold by means of a comparator, and discharging the charge storage device.

BACKGROUND OF THE INVENTION

Various possibilities are known for realizing an oscillator in integrated semiconductor circuit technology. While, for so-called LC oscillators, the oscillating frequency is set by an inductance and a capacitance, for ring oscillators, this is realized by propagation effects. For a so-called relaxation oscillator, which is also designated as a toggle generator, a capacitor determines the time response. The capacitor is alternately charged and discharged. In this way, the capacitor is normally charged until its voltage exceeds an upper threshold. When this occurs, a discharge process is started and the capacitor is discharged. Then, for example, when the capacitor falls below a lower threshold with its voltage, the entire cycle is repeated. This results in a triangular or sawtooth-shaped voltage profile.

Such an oscillator arrangement according to the class is shown, for example, in FIG. 1 in the document Michael P. Flynn, Sverre U. Lidholm: A 1.2-µm CMOS Current-Controlled Oscillator, IEEE Journal of Solid-State Circuits, Vol. 27, No. 7, July 1992.

In portable or battery-operated applications, it is of great importance to realize switching circuits that operate at very low current levels, in order to save energy. This applies especially for devices that are powered by weak current sources, such as, for example, solar cells, or piezoelectric crystals, which transform mechanical energy into electrical energy.

Oscillators are needed in portable medical devices, such as blood-pressure or pulse measuring devices, devices for administering insulin, and also in automotive applications, such as monitoring systems for tire air pressure. For the latter, the oscillator is used to wake up the measurement system at regular intervals. In all of the described cases, it is desirable that the oscillator consumes the lowest possible energy and that it is also insensitive to temperature fluctuations and power-supply voltage fluctuations.

An RC oscillator is specified in the document U.S. Pat. No. 4,205,279. For generating switch-over thresholds, resistors and bipolar transistors are provided. However, this circuit cannot be built entirely using metal oxide semiconductor or MOS circuit technology. In addition, the current source provided, comprising a P-channel MOS transistor wired as a diode with a connected resistor, is not suitable for especially low energy requirements, and the BIAS source suffers from temperature fluctuations.

The document U.S. Pat. No. 4,714,901 relates to a temperature-compensated complementary metal-isolator semiconductor oscillator. A voltage divider is shown, which is refined for generating a temperature-stable reference voltage. However, this principle is not suitable for generating extremely small BIAS currents.

An oscillator with reduced temperature dependence is shown in the document U.S. Pat. No. 4,868,525. This document takes advantage of the property of achieving partial temperature compensation with resistors having different temperature coefficients. However, complete temperature compensation is not possible.

The document U.S. Pat. No. 4,963,840 shows a delay-controlled relaxation oscillator. Two comparators are used for switching the charging and discharging current. Although this circuit has reduced current consumption through the proposed switching principle, it is not suitable for extremely low current consumption due to the voltage divider for generating a reference level.

The document U.S. Pat. No. 5,461,590 shows an oscillator with a constant current source, which works independently of voltage fluctuations and temperature fluctuations. The operation of this constant current source is explained in more detail in document U.S. Pat. No. 5,315,230. Here, it is provided to charge a reference capacitor, in order to generate a delay that fixes the cycle period of an output signal of the oscillator. However, because very large resistors are needed in order to generate a charging current on the order of one µA, this switching circuit is also not suitable for further reduction of the current consumption.

The circuit in document U.S. Pat. No. 5,604,467 comprises a multivibrator with a temperature-compensated current source and a voltage generator for generating a nearly constant voltage as a function of the temperature. Here, because large resistors are also used for generating small BIAS currents, this principle is not suitable for an especially low current consumption of an oscillator.

An oscillator with stable cycle frequency that is not sensitive to temperature fluctuations is shown in document U.S. Pat. No. 6,020,792. There, a bandgap source is used. Currents, which are proportional to the absolute temperature, and also temperature-constant currents are both generated. This is used for charging a reference capacitor. Due to the bandgap circuit that is used, however, this principle is not suitable for generating power-supply currents of less than 100 nanoamperes.

SUMMARY OF THE INVENTION

One object of the present invention is to provide an oscillator arrangement and a method for generating a periodic signal in which the current consumption is further reduced.

These and other objects are attained in accordance with one aspect of the present invention directed to an oscillator arrangement comprising a charge storage device, and a comparator with a first input, which is connected to the charge storage device for feeding a signal dependent on its charge state, with a second input for feeding a switching threshold, and with an output, which is connected to the charge storage device. The comparator comprises a current comparator with two current branches, which are coupled to the inputs of the comparator and of which at least one current branch is connected to the charge storage device and is adapted for guiding a charging and/or discharging current of the charge storage device.

Another aspect of the present invention is directed to a method for generating a periodic signal with the steps of charging a charge storage device with a charging current, comparing a signal that is dependent on the charge state of the charge storage device with a switching threshold by means of a comparator, discharging the charge storage device, and guiding the charging current via at least one of several current branches of the comparator.

In a current mode comparator, two current-controlled branches are provided. While one of the current branches is dependent on the charge state of the charge storage device, preferably the voltage across the capacitor, the other current branch is dependent on a switching threshold. The switching threshold is used for switching between charging and discharging or between discharging and charging of the charge storage device. Here, one of these two current branches of the comparator is simultaneously used as a charging current branch for guiding the charging current with which the charge storage device is charged or discharged. Thus, the number of current-leading branches is reduced. This allows clear savings in terms of current consumption of the circuit.

The two current branches of the comparator are preferably coupled to each other by means of a current mirror.

Here, the current mirror preferably comprises two transistors of unipolar type, each with a controlled path. A terminal in the controlled path of one of the transistors is preferably connected to an input for feeding the switching threshold, while a terminal of another transistor of the current mirror is preferably connected to a connection for terminal to the charge storage device. The output terminal of the comparator is preferably formed on a free end of a controlled path of the output-side transistor of the current mirror.

A discharge current branch can be wired parallel to the charge storage device. The discharge-current branch preferably has a switchable construction and comprises either a switch parallel to the charge storage device or a switchable current source or current sink parallel to the charge storage device. The switch is preferably triggered as a function of an output signal of the comparator.

For this purpose, a control unit is advantageously provided with an input that is connected to the output of the comparator, and with an output that is connected to a control input for connecting and disconnecting the discharging current branch.

The control unit preferably comprises a multivibrator, such as, for example, an RS flip-flop.

Alternatively, a digital circuit can be provided with memory.

In order to achieve even further reduction of the current consumption, the control unit can be preferably controlled with a voltage regulator for its voltage supply.

The output of the oscillator arrangement, at which a triangular or sawtooth voltage can be provided, is advantageously formed at the output of the comparator.

In another refinement, a frequency divider is wired between the output of the comparator and the oscillator output.

The frequency divider is likewise preferably coupled to the voltage regulator for its voltage supply.

The switching threshold for the comparator is preferably provided with a reference voltage source.

The reference voltage source is advantageously constructed for providing a voltage that is proportional to absolute temperature PTAT.

In order to realize two switch-over time points that can be adjusted and predetermined, preferably another comparator is provided. This has a first input that is connected to the charge storage device for feeding a charge state-dependent signal, a second input for feeding another switching threshold, and an output that is connected to the charge storage device, wherein one of the two switching thresholds is an upper switching threshold and the other of the two switching thresholds is a lower switching threshold.

For the other comparator, there can be an additional reference voltage source for providing the other switching threshold.

Also, the other reference voltage source is preferably constructed to provide a voltage that is proportional to absolute temperature.

Preferably, a common BIAS current source is provided, which is connected on the output side to the current branches of the comparator or comparators. Also, the reference voltage source and the optionally provided additional reference voltage source are advantageously powered by the common BIAS current source with a BIAS signal. In this way, the rectifying properties of the circuit are further improved.

DETAILED DESCRIPTION OF THE DRAWINGS

Below, identical reference symbols designate parts that are identical or that have identical functions.

Figure 1:
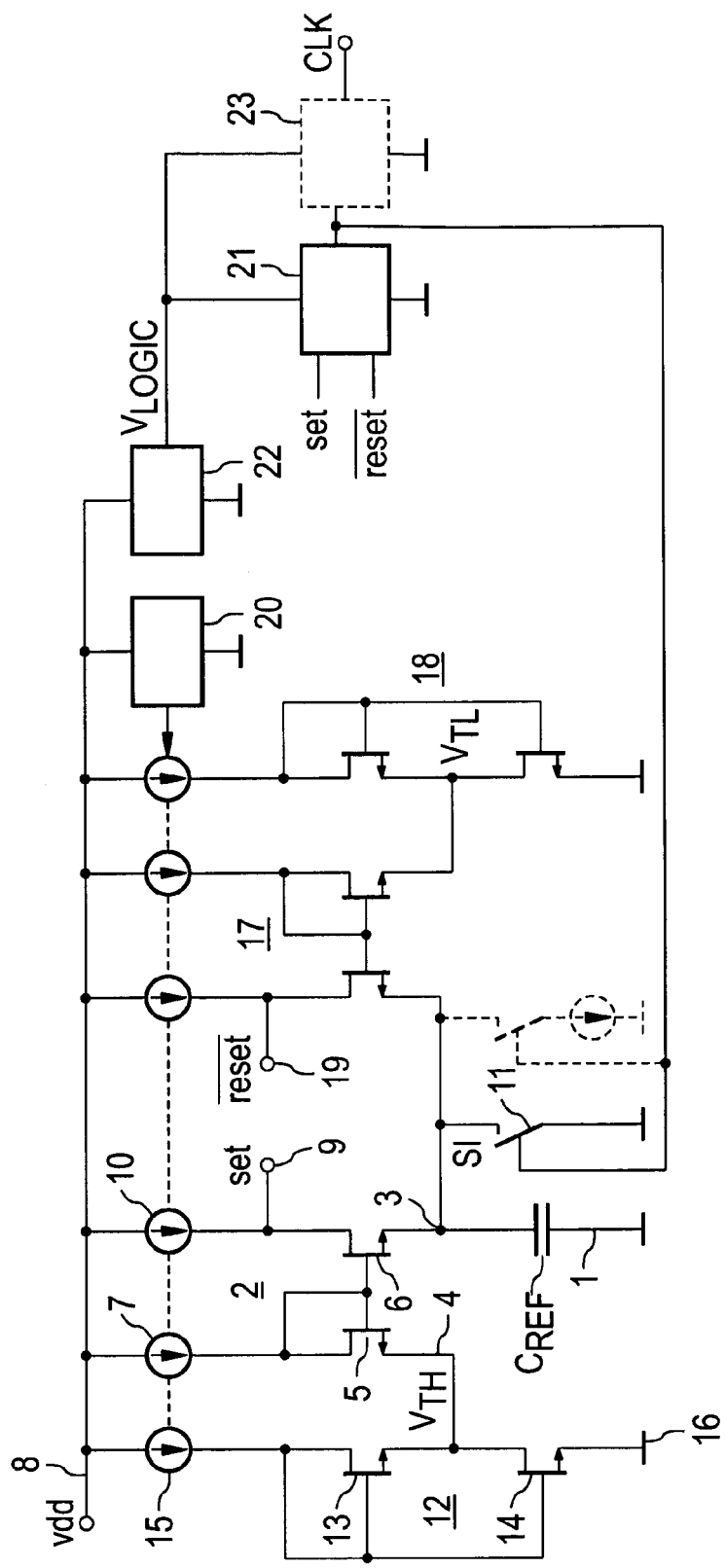
FIG. 1, a first embodiment of the invention with reference to a circuit diagram, FIG. 2, an example refinement of the circuit of FIG. 1 with reference to a circuit diagram, FIG. 3, the setup of a current comparator using an example, FIG. 4, an example of a current comparator with reference voltage source and common BIAS current power supply, FIG. 5, an embodiment of a voltage regulator, and FIG. 6, an example signal profile of the capacitor voltage of a relaxation oscillator.

FIG. 1 shows an oscillator arrangement. The time response is determined by a reference capacitor as the charge storage device 1. A first comparator 2 has a first input 3, which is connected to the charge storage device 1. A second input 4 of the comparator is used for applying an upper switching threshold $V_{TH}$. The comparator 2 comprises two current branches, which are connected to each other by means of a current mirror. The current mirror comprises a first transistor 5 and a second transistor 6. The first transistor 5 is connected as a diode. The drain terminal of the input-side current mirror transistor 5 is connected to its gate terminal and via a current source 7 to a power supply potential terminal 8. The source terminal of the first transistor 5 forms the input 4. The output-side transistor 6 of the current mirror is connected to its drain terminal, which simultaneously forms the output 9 of the comparator 2, via a current source 10 to the power supply potential terminal 8. The source terminal of the output-side current mirror transistor 6 forms the input 3. A discharge current branch, which comprises a switch 11, is connected in parallel to the charge storage device 1.

A first reference voltage source 12 comprises two transistors 13, 14 connected in series in terms of their controlled paths. This series circuit is connected between a current source 15, which is connected to the power supply potential terminal 8, and a reference potential terminal 16. The gate terminals of the two transistors 13, 14 of the first reference voltage source 12 are connected to each other and to the current source 15. The output of the reference voltage source, which is connected to the input 4 of the comparator 2, is formed at the connection node of the controlled path of the transistors 13, 14.

A second comparator 17 with a second reference voltage source 18 is built mirror symmetrically to the first comparator 2 and the first reference voltage source 12. One of the two inputs of the second comparator 17 is similarly connected to the charge storage device 1. An output 19 of the second comparator 17 is formed at the output-side transistor of the current mirror of the second comparator 17.

The current sources 7, 10 of the first comparator 2, the current source of the first reference voltage source 15, and also the current sources of the second comparator 17 and the second reference voltage source 18 are triggered by a common BIAS source 20. A control unit 21 has two inputs, which are connected to the outputs 9, 19 of the comparators 2, 17. An output of the control unit 21 is connected to a control input of the switch 11 for its triggering. In terms of its power supply, the control unit 21 is connected to the power supply potential terminal 8 via a voltage regulator 22. The voltage regulator 22 provides a power supply voltage $V_{LOGIC}$ that is smaller relative to the voltage VDD at the power supply potential terminal 8. The output of the control unit 21 is further connected to a frequency divider 23, at whose output the output cycle signal CLK of the oscillator of FIG. 1 is provided. The frequency divider 23 is connected for its voltage supply to the output of the voltage regulator 22.

The comparator 2 compares the current voltage drop across the charge storage device 1 with the upper switching threshold $V_{TH}$, which the first reference voltage source 12 supplies. For a charging process of the charge storage device 1, as soon as the voltage across the charge storage device 1 exceeds this upper switching threshold, at the output 9 a signal SET is issued to the control unit 21, which then starts the discharge process by closing the switch 11. Through the subsequent discharging of the charge storage device 1, as soon as the voltage across the charge storage device 1 falls below a lower switching threshold $V_{TL}$, which the second comparator 17 determines, this outputs an inverted reset signal RESET to the control unit 21 at the output 19. Then this opens the switch 11 again, as soon as the charge storage device 1 is charging again.

In the present case, the charge storage device 1 is charged not through a separate current branch, but instead an already existing current branch of the comparators 2, 17 is used. Therefore, at least one current-leading branch of the circuit is eliminated. Therefore, a clear reduction in the current requirements of the circuit is possible. The present circuit manages with a typical power supply current of only 10 nA including BIAS power supply and control logics. For the proposed circuit, the sensitivity relative to temperature fluctuations and fluctuations of the power-supply voltage VDD is very small. The typical temperature coefficient that can be achieved with the proposed principle equals 300 ppm per ° C. The proposed circuit architecture is especially suitable for applications in which the power consumption is critical, for example, for so-called ultra-low power applications with weak power sources as explained above.

The proposed construction comprises a self-biased current reference for generating a charge current proportional to the absolute temperature. The charge storage device 1 is charged with this current source. The voltage across the charge storage device 1 is compared with each reference voltage $V_{TH}$, $V_{TL}$, which is similarly proportional to the absolute temperature. Therefore, temperature fluctuations are compensated with first order accuracy.

Instead of the proposed current source 10, 7, 15, other current sources could also be used.

The proposed current source also reduces the current consumption through the common use of current mirrors with unit values of amplifications. The proposed current source 10 preferably uses MOSFET transistors, which are operated either in weak inversion or in moderate inversion. As a result, this switching circuit can be operated with especially low power supply voltages and consumes less power than previously proposed current sources of this type.

Current mirrors could also be used which are not based on resistance unit values. This would result in higher power consumption than for the use of current mirrors with unit values based on amplification.

The powering of the RS flip-flop in the control unit 21 for switching over between charging and discharging operations of the charge storage device with reduced power supply voltage further reduces the total current consumption of the arrangement.

Figure 2:
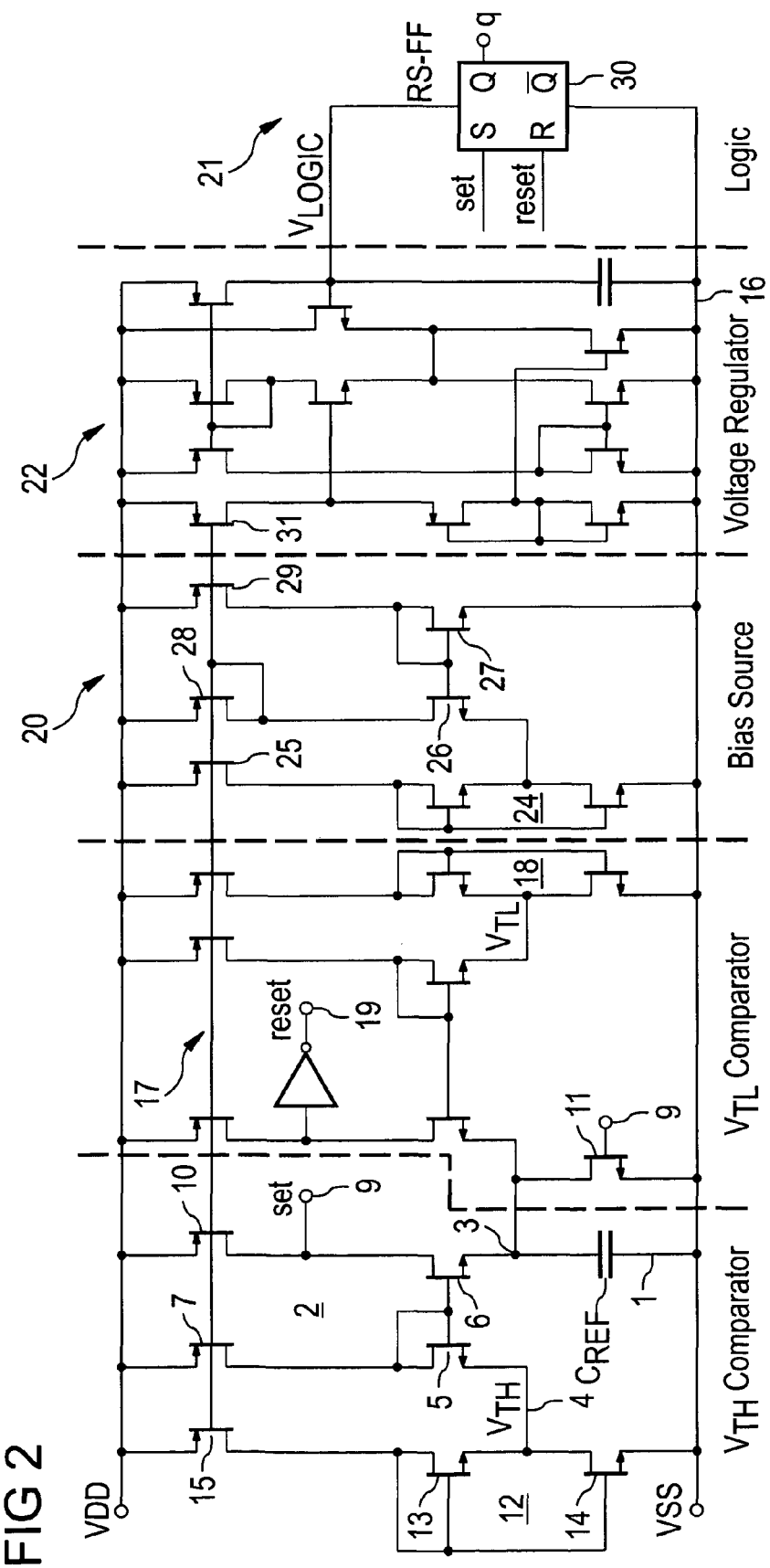

FIG. 2 shows a refinement of the circuit of FIG. 1 using an example. In so far as these embodiments correspond in the components that are used and their advantageous wiring and function, repetition of the description will be avoided at this point.

With respect to the comparators 2, 17 and the reference voltage sources 12, 18, FIG. 2 is refined to the extent that the current sources 7, 10, 15 of these functional blocks are constructed as unipolar transistors, whose gate terminals are connected to each other and to an output of a BIAS source 20. The BIAS source 20 comprises, in detail, a first current branch for forming a reference source 24 with two transistors connected in series, whose setup and wiring correspond to the reference voltage source 12. This series circuit is also connected between a current source transistor 25 and the reference potential terminal 16. The current source transistor 25 is connected at its source terminal to the power-supply potential terminal 8. The output pick-up of the reference voltage source 24 is connected to the source terminal of an output-side transistor 26 of a current mirror 26, 27. The transistors 26, 27 of the current mirror are connected to each other on the gate side. The input-side transistor 27 of this current mirror has a gate connected to its drain terminal. The source terminal of the input-side current mirror transistor 27 is connected to the reference potential terminal 16. Another current mirror comprises two transistors 28, 29 connected on the source side to the power-supply potential terminal 8. While the drain terminal of the input-side transistor 28, connected as a diode, is connected to the drain terminal of the transistor 26, the drain terminal of the output-side transistor 29 of the other current mirror is connected to the drain terminal of the transistor 27. The gate terminals of all of the transistors 25, 28, 29 of the BIAS source 21, which are connected to the power-supply potential terminal 8, are connected to each other at the output connection node of the BIAS source.

The control unit 21 is constructed in FIG. 2 as RS flip-flop 30. The RS flip-flop 30 has a set input S, a reset input R, an output Q, and an inverted output. A power-supply voltage terminal of the control unit 21, in the present case the flip-flop 30, is connected to an output of a voltage regulator 22. The set input S is connected to the output 9 of the first comparator 2. The reset input R is connected to the output 19 of the second comparator 17. The output Q of the RS flip-flop 30 is connected to a gate terminal of a transistor, whose controlled path is connected in parallel to the charge storage device 1 and represents the switch 11.

The voltage regulator 22 is in FIG. 2 has the setup described below with reference to FIG. 5, wherein its BIAS current source 31 is constructed as a transistor, whose gate terminal for the bias power supply of the voltage regulator 22 is similarly connected to the output of the BIAS source 20.

The output of the second comparator 17 is connected to the reset input R of the flip-flop 30 via an inverter.

Figure 3:
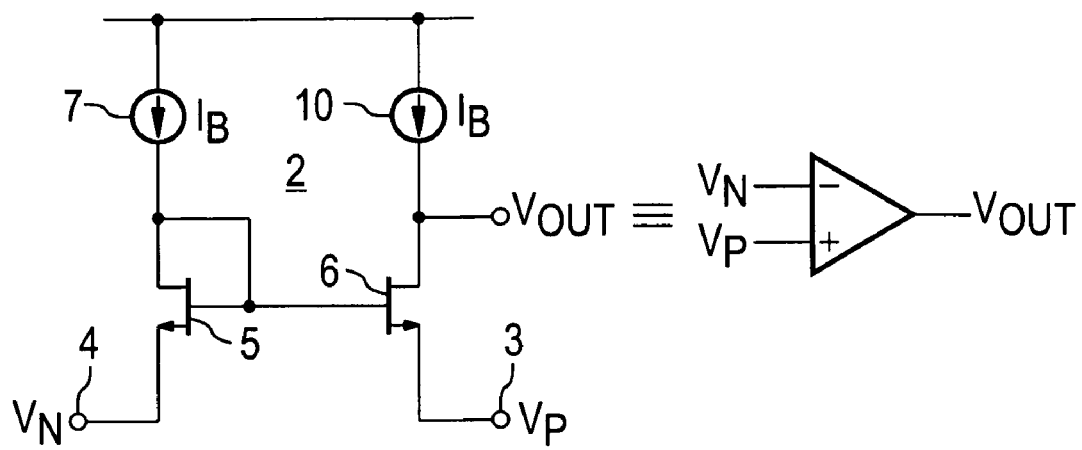

FIG. 3 shows how of the current comparator 2 of FIG. 1 is used according to an embodiment of the invention. In addition, to the right, the equivalent circuit diagram of a comparator for two input voltages $V_N$, $V_P$ at its inputs is shown. The setup and the function of the comparator 2 was already explained in detail with reference to the first comparator 2 of FIG. 1 and therefore shall not be described again at this point.

Figure 4:
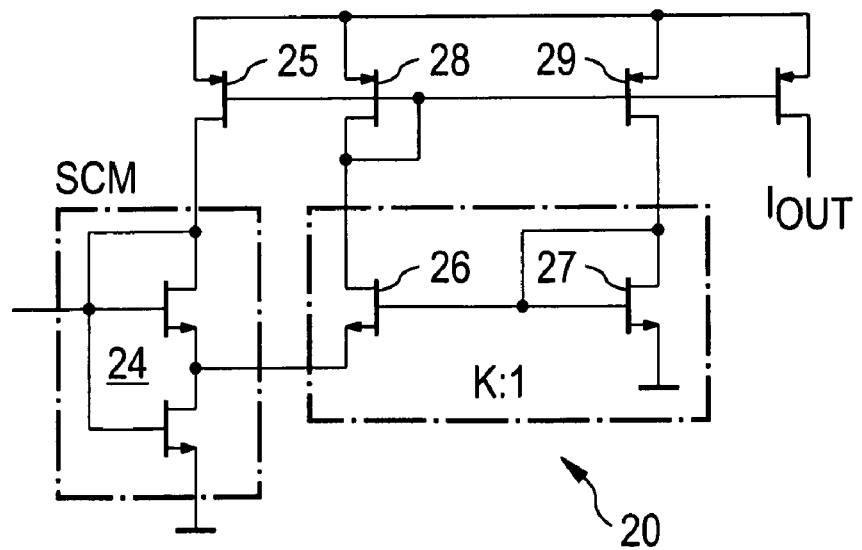

FIG. 4 shows the BIAS source 20 of FIG. 2. Because the circuits essentially correspond to each other in setup and function, the description shall not be repeated at this point. As already explained, it is advantageous to use current mirrors with unit values of the associated components, because in this way further reduction of the current consumption is possible. The associated transistors are operated either in weak inversion or in moderate inversion, which reduces the current consumption of the so-called self-biased current source even further. The dimensioning can be set by the conversion ratio K of the current mirror 26, 27.

Figure 5:
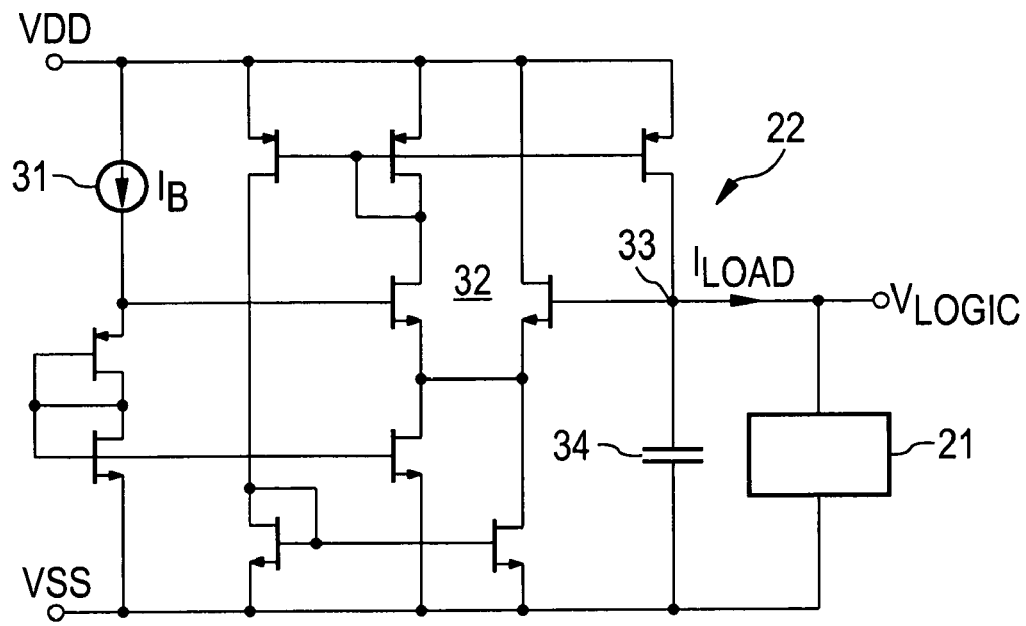

FIG. 5 shows the voltage regulator 22 of FIG. 2. It comprises an amplifier 32 with adaptive BIAS regulation. The amplifier 32 is constructed as a differential amplifier. The BIAS current source 31 of this voltage regulator is powered preferably by the common BIAS source 20 and controls one of the inputs of the differential amplifier 32. The output node 33 of the voltage regulator 22 is stabilized by means of a support capacitor 34 and simultaneously fed back to one of the other of the inputs of the differential amplifier 32.

Figure 6:
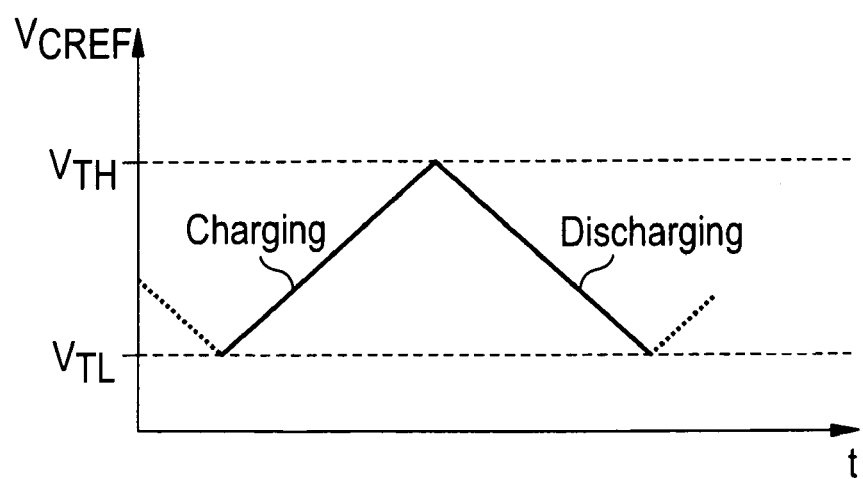

FIG. 6 shows as an example a voltage profile of a relaxation oscillator, as is shown in FIG. 1 or 2 using embodiments. One recognizes the triangular voltage profile across the capacitor of the charge storage device 1, which runs between the lower switching threshold $V_{TL}$ and the upper switching threshold $V_{TH}$.

Obviously, the circuit can be constructed in alternative embodiments also in other than the shown MOS circuit technology.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An oscillator arrangement, comprising:
    a charge storage device; and
    a comparator with a first input, which is connected to the charge storage device for feeding a signal dependent on its charge state, with a second input for feeding a switching threshold, and with an output, which is connected to the charge storage device;
    wherein the comparator comprises a current comparator with two current branches, which are coupled to the inputs of the comparator and of which at least one current branch is connected to the charge storage device and is configured to guide at least one of a charging and discharging current of the charge storage device, a first current branch, which is current-controlled by the charge state-dependent signal, and a second current branch, which is current controlled by the switching threshold.

2. The oscillator arrangement according to claim 1, wherein the two current branches of the comparator are coupled to each other via a current mirror.

3. The oscillator arrangement according to claim 1, further comprising:
    a discharging current branch that is connectable and disconnectable connected in parallel to the charge storage device.

4. The oscillator arrangement according to claim 3, further comprising:
    a control unit having an input that is connected to the output of the comparator, and an output that is connected to a control input for connecting and disconnecting the discharge current branch.

5. The oscillator arrangement according to claim 4, further comprising:
    a voltage regulator configured to provide a reduced voltage, whose output is connected to a power supply connection of the control unit.

6. The oscillator arrangement according to claim 4, further comprising:
    a frequency divider is connected to the output of the control unit.

7. The oscillator arrangement according to claim 1, further comprising:
    a reference voltage source, whose output is connected to the second input of the comparator for feeding the switching threshold.

8. The oscillator arrangement according to claim 7, wherein the reference voltage source is configured to provide a voltage that is proportional to absolute temperature.

9. The oscillator arrangement according to claim 1, further comprising:
    another comparator with a first input that is connected to the charge storage device for feeding a charge state-dependent signal, with a second input for feeding another switching threshold, and with an output that is connected to the charge storage device;
    wherein one of the two switching thresholds is an upper switching threshold and another of the two switching thresholds is a lower switching threshold.

10. The oscillator arrangement according to claim 9, further comprising:
    another reference voltage source, whose output is connected to the second input of the other comparator for feeding the other switching threshold.

11. The oscillator arrangement according to claim 10, wherein the other reference voltage source is configured to provide a voltage proportional to absolute temperature.

12. The oscillator arrangement according to claim 1, further comprising:
    a common bias current source connected on an output side to the current branches of the comparator.

13. A method for generating a periodic signal with the steps of:
    charging a charge storage device with a charging current;
    comparing a signal that is dependent on the charge state of the charge storage device with a switching threshold by a comparator comprising a first current branch, which is current-controlled by the charge state-dependent signal, and a second current branch, which is current controlled by the switching threshold;
    discharging the charge storage device; and
    guiding the charging current via at least one of several current branches of the comparator.

14. The method according to claim 13, further comprising:
beginning the discharging of the charge storage device when the signal that is dependent on the charge state of the charge storage device exceeds the switching threshold.

15. The method according to claim 13, further comprising:
comparing a signal that is dependent on the charge state of the charge storage device with another switching threshold.

16. The method according to claim 15, further comprising:
ending the discharge of the charge storage device when the signal that is dependent on the charge state of the charge storage device falls below the other switching threshold.

17. An oscillator arrangement, comprising:
a charge storage device; and
a comparator with a first input, which is connected to the charge storage device for feeding a signal dependent on its charge state, with a second input for feeding a switching threshold, and with an output, which is connected to the charge storage device;
wherein the comparator comprises a current comparator with two current branches, which are coupled to the inputs of the comparator and of which at least one current branch is connected to the charge storage device and is configured to guide at least one of a charging current and a discharging current of the charge storage device; and
wherein the two current branches of the comparator are coupled to each other via a current mirror.

18. An oscillator arrangement, comprising:
a charge storage device; and
a comparator with a first input, which is connected to the charge storage device for feeding a signal dependent on its charge state, with a second input for feeding a switching threshold, and with an output, which is connected to the charge storage device; and
a discharging current branch connected in parallel to the charge storage device, the discharging current branch being connectable and disconnectable;
wherein the comparator comprises a current comparator with two current branches, which are coupled to the inputs of the comparator and of which at least one current branch is connected to the charge storage device and is configured to guide at least one of a charging current and a discharging current of the charge storage device.

* * * * *